Inventor:-
Dale T. Kelley,
By Mueller & Aichele Atty's.

Oct. 30, 1962 D. T. KELLEY 3,061,766

SEMICONDUCTOR DEVICE

Original Filed Sept. 25, 1956 3 Sheets-Sheet 2

Inventor:-
Dale T. Kelley,
By Mueller & Aichele
Atty's.

Oct. 30, 1962 D. T. KELLEY 3,061,766

SEMICONDUCTOR DEVICE

Original Filed Sept. 25, 1956 3 Sheets-Sheet 3

INVENTOR.

Dale T. Kelley,

BY

Mueller & Aichele

Atty's.

3,061,766
SEMICONDUCTOR DEVICE

Dale T. Kelley, Phoenix, Ariz., assignor to Motorola, Inc., Chicago, Ill., a corporation of Illinois Continuation of application Ser. No. 611,840, Sept. 25, 1956. This application Oct. 21, 1959, Ser. No. 847,735
21 Claims. (Cl. 317—234)

This application is a continuation of my copending application, Serial No. 611,840, filed September 25, 1956, which in turn is a continuation-in-part of my copending application Serial No. 551,498, filed December 7, 1955.

The present invention relates to semiconductor devices and a method for manufacturing the same. Such invention is described herein as embodied in a power transistor and in the method for making that particular transistor, but it will be obvious as the description proceeds that in its complete concept, the invenion is not limited alone to such embodiment. Furthermore, this continuation application is limited to semiconductor devices, and the method of the original application will be prosecuted in a divisional application filed on even date herewith, but the method disclosure is retained in this present application for a better understanding of my complete invention.

A power transistor can be considered generally as a semiconductor device for controlling or amplifying power from either an A.C. or a D.C. source. However, that which distinguishes a power transistor from other semiconductor devices is its high heat dissipation characteristic. By the same token, a power transistor is commercially acceptable in the average electronic circuit application in proportion to its ability to dissipate the generated heat therein, as well as to maintain long life and acceptable operating characterisics in normal as well as severe ambient temperture conditions. In fact, power transistors are generally rated on the basis of maximum junction temperature and on the temperature difference per watt between the junction and the mounting base of the device. At the same time, a power transistor in order to be competitive in the electronic field must be rugged mechanically as well as electrically, and must be low in cost.

Although there has been a need for a power unit since the advent of the transistor and a great deal of research and engineering has gone into semiconductor devices generally, and into power transistors specifically, the art had not reached acceptable levels in the above-noted respects for most applications until the advent of the present invention. Excessive internal heating upon operation of a power transistor reduces its power handling ability by producing distortion of the signals translated by the device, and it can destroy the semiconductor subassembly within the device. This internal heating is principally developed at the collector junction of the transistor. Prior constructions for dissipating the heat have included a bolt or the like extending from the collector junction and through the housing to the outside of the transistor, and another power transistor construction has an enclosure with cooling fluid therein in contact with such junction, but these expedients caused complications in assembly, increased the cost, and did not satisfactorily remove the generated heat.

The susceptibility of semiconductor devices including power transistors to heat damage, to chemical contamination, and to damage by dirty processing has made manufacturing prior to the present invention both difficult and expensive. Heat necessary for soldering with flux was objectionable. Similarly, welding, particularly in encapsulating the unit, caused heat damage, and has not been a satisfactory means for securing parts together.

It is an object of the present invention to provide a semiconductor device which will perform satisfactorily as to its electrical requirements for power control or amplification at ambient temperatures under 90° C.

A further object is to provide a semiconductor device which will have a high heat-dissipation characteristic which is at least one watt per 1° C. differential between the collector electrode and the mounting for the device so that internal heat generation during operation will not be harmful to the device itself or to its operation. In that connection, it is an object to provide a collector electrode structure and assembly which will insure high heat-dissipation capabilities for the device.

It is also an object to provide a structure which will accomplish the preceding objects in a simple, rugged, and low-cost device.

A still further object of my invention is to provide a method for manufacturing a semiconductor device coming within the objects as above-noted, and a method which will avoid mechanical or chemical injury to the internal semiconductor assembly during complete manufacture so as to provide maximum life in the device, and yet provide a method which will keep the final cost of the device at a competitive level.

One of the features of the present invention is the provision of a semiconductor device of which a power transistor is a specific embodiment, wherein a pre-assembled semiconductor portion thereof is mounted directly upon a base which serves as a sturdy and readily assembled frame and when it is a part of the final device acts successfully to dissipate heat during the operation of the device. As a result, the device will perform satisfactorily and with a long life in ambient temperatures up to 90° C., and has performed at temperatures in excess thereof.

Another feature of my invention is the provision of a one-piece stamped metal base of substantial thickness with high heat dissipation capability and of a configuration for easy mounting in electronic equipment, which base has an integral pedestal or raised portion therein to serve directly as a mechanical mounting for a pre-assembled semiconductor unit and at the same time to serve with the remainder of the one-piece base as one of the electrodes of the semiconductor device. In this assembly the pedestal portion becomes the collector junction mounting, and the heat generated at the junction is conducted with maximum efficiency therefrom.

The stamped metal base for the device of my invention represents additional features in that its diamond-shaped configuration may be stamped out with a minimum of metal scrap or wastage without impairing the thermal properties of the base. In addition this confiuration and the integral raised pedestal therein have the double function first, of permitting a broad effective thermal contact with a heat radiator to which it is mounted in the electronic apparatus, and secondly, of providing heat conduction from the semiconductor unit on the pedestal and through the remainder of the base to the radiator which is so rapid that there is less than 1° C. difference in temperature between the semiconductor junction at the pedestal and the heat radiator per watt of power dissipated.

A further feature of the invention is the provision of a semiconductor unit made up as a pre-assembly and a one-piece metal clip which serves as a frame for the unit when the latter and the clip go together very readily as a subassembly. Then this subassembly serves a self-jigging function and facilitates production in the assembly of the complete semiconductor device. This is important in the transistor art wherein elements are small and sometimes fragile such as to normally complicate the handling thereof during manufacture.

An important feature of my invention is the provision of a structure with components, subassemblies, and a final structure which all together make possible the successful utilization of my method of manufacturing a power transistor on a mass production basis, in a continuous operation, and with relatively unskilled personnel.

Another feature in the method of my invention is the provision of silver plating and gold plating for the metal elements of the device, employing preformed solder rings at points for solder junctures, and then accomplishing the soldering in an inert or reducing atmosphere in a heated furnace so that the assembly of such elements is complete without the use of flux. Eliminating flux eliminates the dangers therefrom of injury to the transistor, and makes for an inexpensive reliable transistor.

A still further feature of my invention is the provision of a cold sealing method for applying a housing to the semiconductor assembly which provides an airtight long-time seal or closure for the delicate parts inside without the dangers inherent in effecting such a closure by soldering or welding with consequent heating as is normally done when securely mounting such a housing on a base.

Referring now to the drawings.

Figure 13:
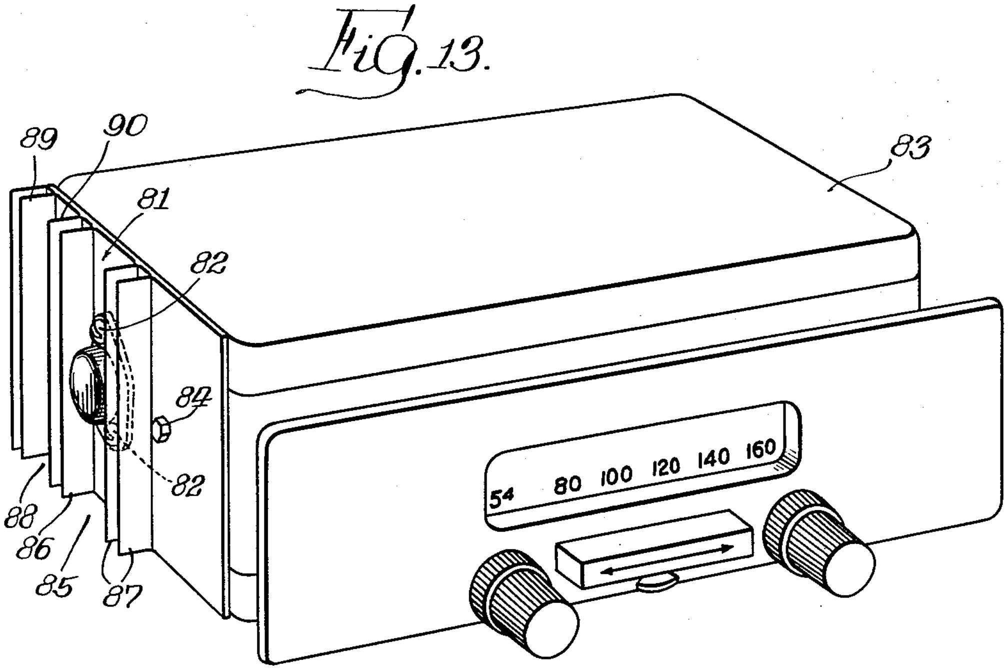
Figure 14:
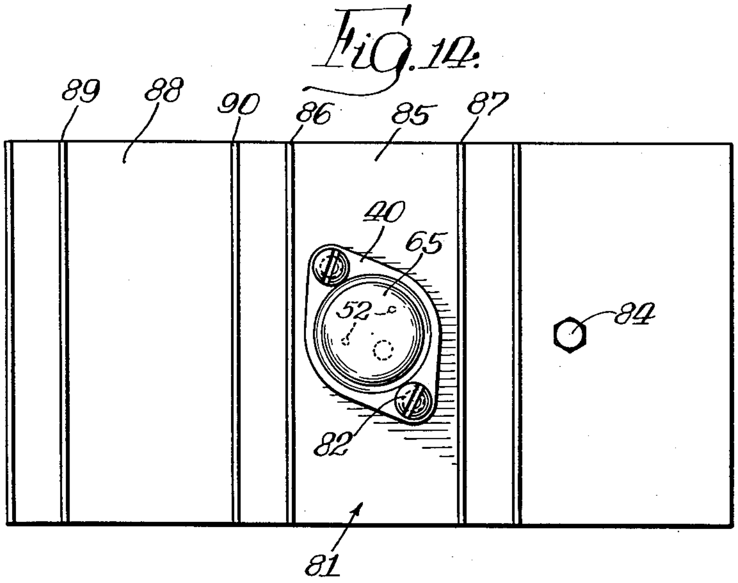

FIG. 13 is a front perspective view of an auto radio receiver showing a power transistor of the present invention mounted on a heat radiator secured to the radio; and FIG. 14 is an elevational view of the heat radiator to which the power transistor is mechanically and electrically secured. The heat radiator itself and the auto radio receiver form no part of the present invention, but do illustrate a typical installation of the transistor described herein.

In the illustrated embodiment of my invention I provide a p-n-p type of power transistor with a germanium die or wafer having indium emitter and collector buttons alloyed to opposite faces of the germanium, and with a tin-lead-antimony ring fused to the germanium die at the outer edge thereof to provide both mechanical support for the die and an electrical base connection to a clip. The clip in turn has the multiple function of an electrical conductor and a self-jigging frame to position the germanium wafer subassembly when mounting the same for fusing on to a pedestal electrode. Such pedestal is formed integral with a copper one-piece diamond-shaped element serving as a combination mounting base and collector electrode for the power transistor. The mounting base provides a highly efficient thermal path to take the heat which is generated in the operation of the transistor away from the semiconductor unit at its junction with the pedestal electrode to a heat radiator to which the mounting base is thermally and mechanically connected. The diamond-shaped combination base and electrode for the power transistor is stamped from relatively heavy copper and the integral pedestal is coined or swaged therefrom in the stamping step. Thereafter a circular groove is cut in the topside of the base, and this groove is adapted to loosely receive a cap or cover in the last assembly step of manufacture. The last step is a swaging or staking operation wherein metal is pressed over the rim of the cover to provide a tight vacuum sealed enclosure for the operating elements of the transistor. By accomplishing this sealing without heat or solder, the danger of heat injury or solder flux contamination to the internal elements of the transistor is avoided.

This power transistor embodiment of my invention is manufactured in a series of steps which minimize the danger of spoilage or wastage in manufacture and provides an efficient power transistor at low cost. This is accomplished by first providing several subassemblies and then putting together by hand and by machine such subassemblies and additional elements into the complete device. The semiconductor subassembly in the embodiment illustrated comprises a round germanium wafer and two round indium buttons of different size, the smaller button serving ultimately as the emitter, and the larger button as the collector for the semiconductor unit. A tin-lead-antimony ring having an outer circumference corresponding to the other circumference of the germanium wafer provides the base connection for such unit. These elements are assembled in a carbon jig with the collector button on one side, and the emitter button and the base connection ring on the other side of the wafer. The indium buttons are alloyed to the opposite faces of the germanium wafer and the base connection is fused to one side thereof, to provide, when thus assembled, a semiconductor unit that is then placed on a prestamped metal clip having prongs which are bent over to secure the unit thereon. The latter complete subassembly is then mounted on a previously provided subassembly which comprises the copper mounting base and a pair of feed-thrus which had been previously assembled and which will ultimately serve as pronged electrodes for the emitter and the base connections of the semiconductor unit.

Each feed-thru consists of a brass pin with electrical insulating means thereon comprising a glass ring encircling and fitting tightly to the pin at a predetermined place thereon and a metal housing outside of the glass bead and electrically insulated from the pin. A flange is formed near one end of the pin and spaced a predetermined distance from the electric insulator assembly. Each feed-thru is assembled on the copper mounting base with a solder preform between the metal housing on the insulator and such base, and with a solder preform ring on the upper side of the integral flange on the pin. Then, the clip-semiconductor assembly is placed on the mounting-base-feed-thru assembly with the upper portion of each feed-thru prong extending through a corresponding aperture in the clip frame and the clip and semiconductor unit within the clip positioned on the top of the pedestal portion of the base. At that time, the solder preforms and the semiconductor unit are capable of being melted sufficiently to accomplish soldering or fusion of the adjacent parts upon the application of heat to the assembly. This fusion is accomplished by putting the entire assembly into an inert or reducing atmosphere furnace where the clip is fused to the emitter and base connection pins, each feed-thru is soldered to the base plate, the semiconductor unit is fused to the assembly clip, and the electrode of the semiconductor unit is soldered to the pedestal portion of the base. All of this soldering is accomplished by only seven joints, and in an inert or neutral atmosphere of nitrogen or argon which avoids contamination to the internal parts of the unit. Originally, thin silver-gold layers are applied to the base, to the feed-thrus, and to the clip all before assembly, and as a result, the soldering or fusion is completed without flux but providing a strong juncture of the parts.

After soldering or fusion in the furnace, a one-piece metal cap is placed at its rim in the circular groove in the base, and a hydraulic press pushes the rim of the cap to the bottom of the groove and swages the adjacent metal of the base into the groove and into contact with the wall of the cap adjacent the rim so as to provide in a cold-sealing step an air-tight closure for the semiconductor unit. Accomplishing this final sealing step without the use of heat eliminates the danger of injury to the semiconductor unit within the housing and possible early failure of the transistor.

Figure 7:
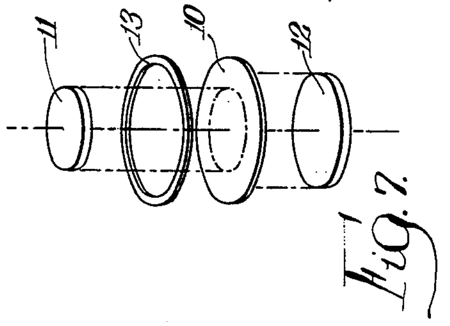
FIG. 7 is an exploded enlarged view of the elements in the semiconductor subassembly to be mounted within the clip of box H, and these elements here shown enlarged are the four illustrated in actual size in boxes D, E and F of FIG. 1.

More specifically, to construct the transistor described above, a disc-shaped wafer or die 10 (FIGS. 1, 7 and 8), composed, for example, of n-type low resistivity germanium is assembled with an emitter button or disc 11 designed to form an emitter junction or electrode, a disc or button 12 designed to form a collector electrode, and a ring 13 designed to form a base electrode or connection. If the die 10 is of n-type semiconductor material, the discs 11 and 12 are of p-type material such as indium, gallium or the like, and the ring 13 is of n-type material such as a known tin-lead-antimony alloy to form an ohmic contact with the die and is assembled on the die in a position surrounding the emitter disc or electrode 11. The assemblage with the emitter and base electrodes on one face of the die and the collector eletctrode on the opposite face of the die is heated in a carbon jig (not shown for it is not specifically a part of the present invention) in an inert atmosphere by a known method to fuse the discs 11 and 12 and the ring 13 to the die 10 to form a transistor die assembly or subassembly. The discs or buttons 11 and 12 now become emitter and collector junctions or electrodes respectively of the die assembly, and the ring 13 is the base electrode. The faces of the die 10 are parallel with the Miller (111) crystallographic planes, so that in the alloying operation planar recrystallized p-n junctions 14 and 15 (FIG. 8) are formed parallel with one another with base region 16 therebetween. Also, during the alloying, outer faces of the discs 11 and 12 are confined in the jig to keep them flat and parallel with the faces of the die 10. The regrowth and junction areas in FIG. 8 should be considered as illustrative showings, for it would be impossible to cross hatch or stipple the areas indicated. The word references are used for explanatory purposes.

Figures 8, 9, 10, 11, 12:
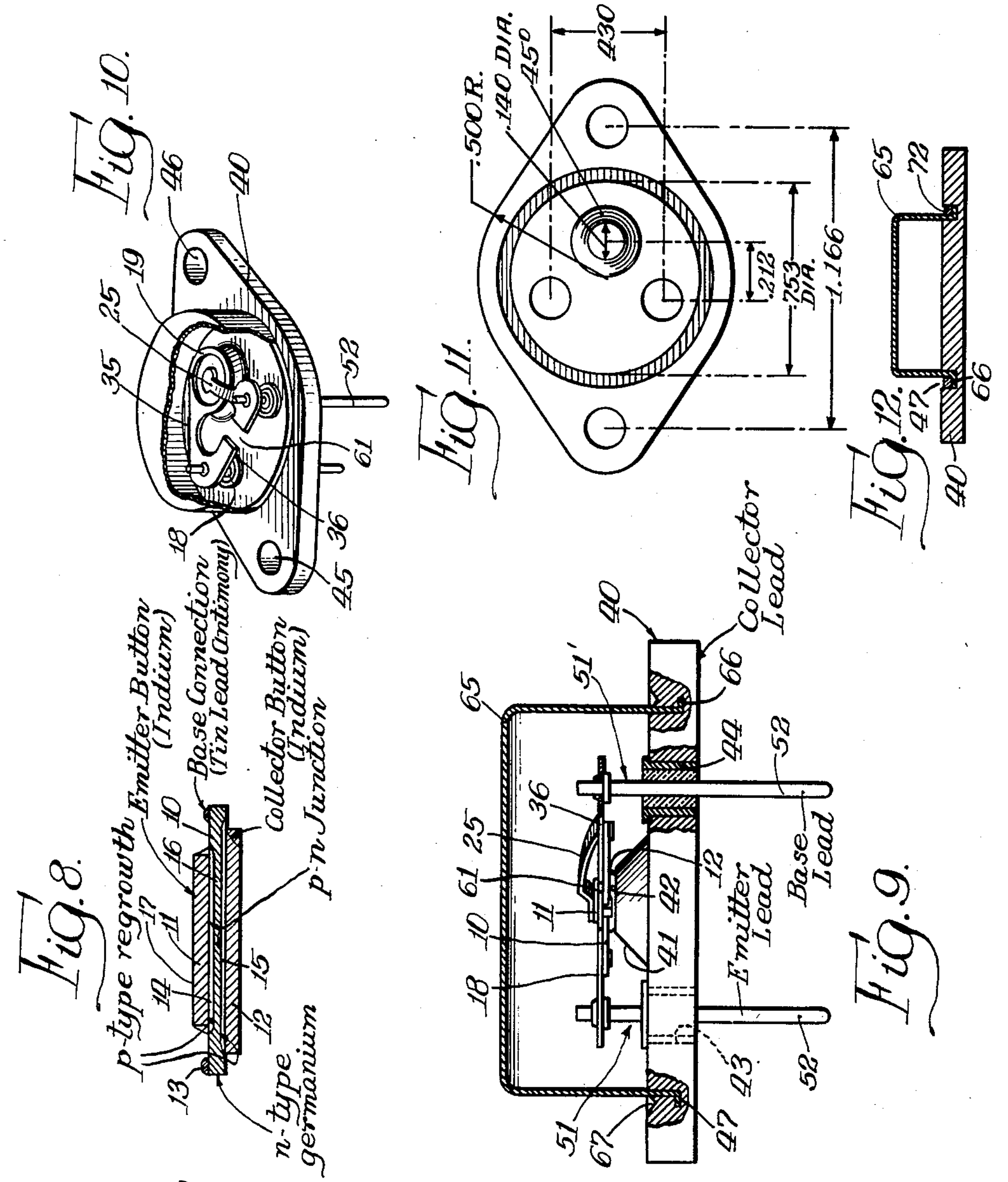
FIG. 8 is a cross sectional view of the assembled semiconductor unit illustrated by elements in smaller size in FIG. 7.
FIG. 9 is an enlarged illustration partly in cross section and partly broken away of the assembled power transistor shown in a top plan view in box M of FIG. 1.
FIG. 10 is a perspective view of the assembled transistor of FIG. 9 with only a portion of the cap broken away.
FIG. 11 is an enlarged plan view of the mounting base of FIG. 2 with various actual dimensions from one embodiment of my invention noted thereon.
FIG. 12 is a cross sectional view of an assembled cap and base shown alone for illustrative purposes as secured together by another cold-sealing method to that of FIG. 9.

To recapitulate, the preassembled device which makes up into the die assembly, or as it is sometimes called, the semiconductor unit of the transistor of my invention is illustrated in the croses sectional enlargement of FIG. 8. This semiconductor unit is illustrated in actual size in box G of FIG. 1 with the side carrying the emitter button 11 and the base connection 13 illustrated at the left in that box and the side carrying the collector button being illustrated therein to the right. The individual pieces are illustrated in actual size in boxes D, E, and F of FIG. 1 and in enlarged size in FIG. 7. Because the pieces are tiny and the relative sizes and the assembled positions thereof are somewhat difficult to readily visualize, dotted projection lines are used in FIG. 7 to show relative sizes and to show how the preformed base connection ring 13 encircles but avoids the emitter button 11 while serving as a frame for the very thin germanium die 10. The ring 13 being tin-lead-antimony, fuses readily to the corresponding face of the germanium. The base connection thereby provides a very useful framing function and provides a non-rectifying connection to the germanium when the semiconductor unit or die assembly is complete with the collector button alloyed to the germanium wafer or die 10 as shown in FIG. 8. Then in the manufacturing operation, this subassembly is mounted on a one-piece frame and lead element as shown in box I and thereafter the method continues as will be explained.

The die assembly is then placed in a socket or cavity of a plate-like frame or clip 18. The clip 18 is stamped out originally as a one-piece metal member illustrated in the enlargements of FIGS. 4 and 5, and in actual size in box H of FIG. 1. The socket is formed as a flat discontinuous ring portion 19 serving as the bottom of the socket, while the walls of the socket are formed by tabs 21 at points spaced around the periphery of the ring portion 19. The ring 19 engages the base electrode 13 and the tabs 21 are bent over one face of the die 10 as viewed in FIG. 1, box I, in contact only with the die 10 and not touching the collector electrode 12. A plate-like emitter lead or arm 25 of the clip 18 has a disc-shaped end portion 26 with a hole 27 therein, and the portion 26 engages the emitter electrode 11 in the assembly. The emitter lead 25 is arched or bowed so that the end portion 26 is pressed by spring pressure against the emitter button to provide a firm contact therebetween while the bow or arch at the same time prevents contact between the arm 25 and the base electrode 13.

The clip or holder 18 is formed from a strip of brass in a multiple stamping and cutting operation and has holes 31 and 32 formed therein surrounded by concentric flanges 33 and 34 drawn out of the plane of the clip 18. The ring 19 is on the end of the arm portion 35 to form a base lead. An arm portion 36 originally connects the emitter arm 25 and the base arm 35, and the clip 18 is maintained as a one-piece member through the assembly steps represented by the illustrations in boxes H, I and J of FIG. 1. After stamping, the clip 18 which may be brass of a mild spring temper, is plated with silver to form a protective layer over the brass base and to serve as a bonding or soldering material on the portions thereof to be subsequently joined to other elements. Gold is plated in a thin layer over the silver to prevent corrosion of the silver and eliminate any necessity of flux in the subsequent fusing or soldering operation by keeping the surface of the silver untarnished.

Between step J, and the step illustrated at box K the elements are soldered or fused by heating in a furnace into a rigid construction. At this step in the process the clip is cut as shown in box K and the various electrodes are electrically separated.

As is clear from the introduction to this specification, an important factor in the commercial acceptance of a power transistor is high heat dissipation at the collector electrode. This is that electrode in the complete device which is in physical and electrical connection with the collector button 12 (FIG. 8). On a standard rating basis, an embodiment of the power transistor herein described is rated at 10 watts with the base corresponding to the present base 40 (box A, FIG. 1) maintained at 80° C.

This represents power dissipated in the transistor at the collector electrode 12, and means a high dissipation factor, wherein there is at least 1 watt dissipated per degree temperature differential between the collector 12 and the mounting base 40.

Figures 1, 2, 3, 4, 5, 6:
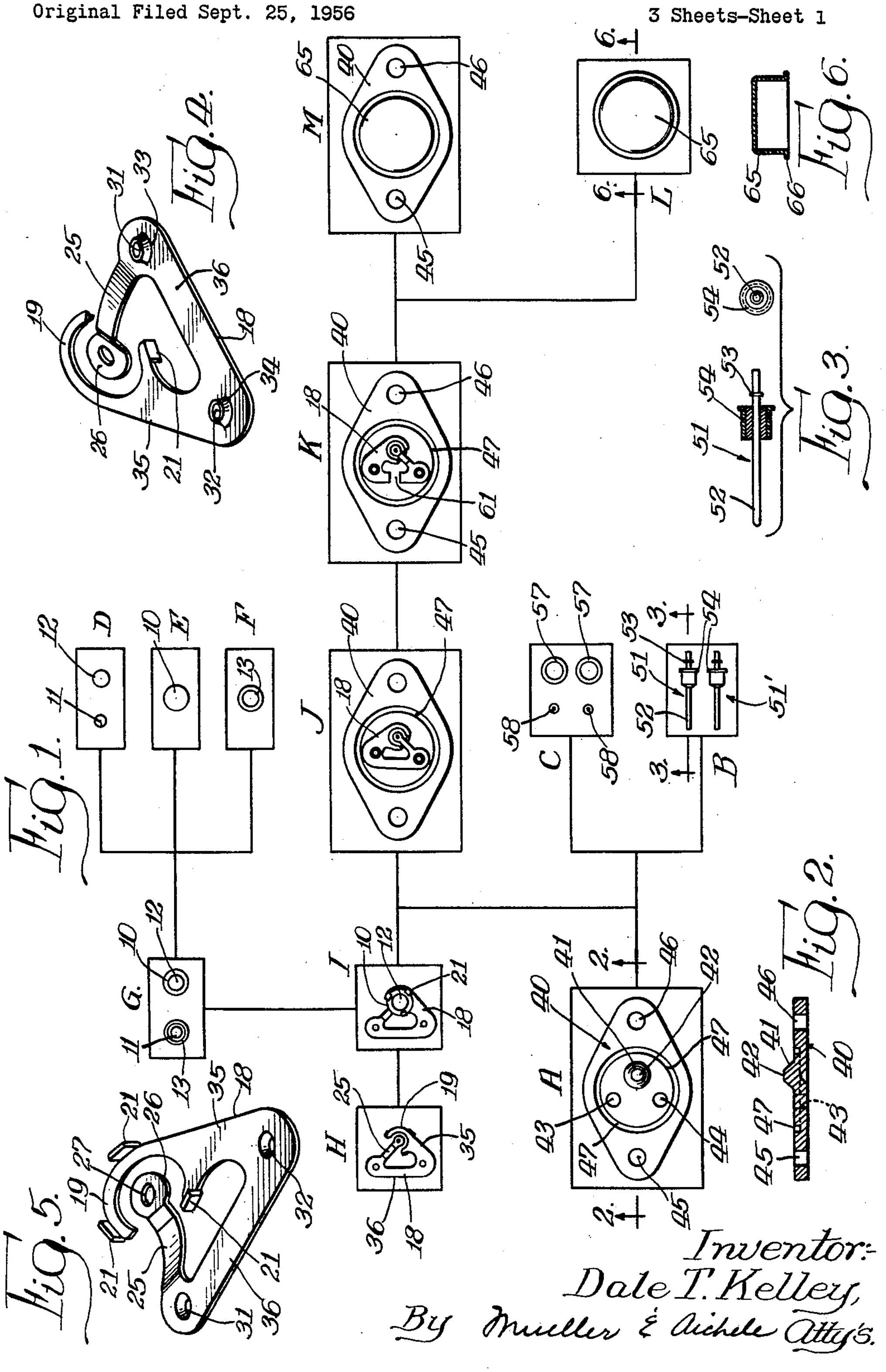
FIG. 1 is a diagrammatic illustration of the steps in manufacturing a power transistor as one embodiment of the present invention, it shows in actual size the elements which go to make up the subassemblies, and shows the subassemblies which go to make up the final encapsulated transistor with such subassemblies in the actual size of those in one embodiment of the invention.
FIG. 2 is a cross section taken along the line 2—2 as shown in box A of FIG. 1, of the one-piece mounting base and collector electrode for the power transistor.
FIG. 3 is a combination view showing an enlargement of the feed-thru subassembly of box B in FIG. 1, with a cross sectional illustration along the line 3—3 of the unit in the box, and a top plan view thereof projected to the right.
FIG. 4 is an enlarged perspective of the one-piece metal clip for holding the semiconductor unit as illustrated in box H of FIG. 1, and which serves as a self-jigging subassembly frame in the manufacturing operation or assembly at the step wherein the pieces are in the position illustrated in box J of FIG. 1.
FIG. 5 is an enlarged perspective of the clip shown in FIG. 4 but inverted from its position in FIG. 4.
FIG. 6 is a cross sectional view along the line 6—6 of the cap illustrated in box L.

Referring more specifically to the mounting base 40, it consists of a diamond-shaped one-piece member in a metal such as copper with high thermal and electrical conductivity characteristics. It is produced by a multiple stamping and coining action which cuts the base 40 from an elongated strip or bar of copper, and in this process a frustoconical pedestal 41 is coined or drawn in the member with a flat top 42 (FIGS. 1, 2 and 11). In addition, holes 43 and 44 for connector subassemblies, and mounting holes 45 and 46 for subsequently mounting the transistor are formed in the heavy copper member. The diamond-shaped mounting base 40, after being so produced from the bar or stock, is then placed in a suitable lathe or the like and a groove 47 is cut therein. Then a heavy silver layer is plated on all the surfaces of the mounting base 40, and a film of gold is plated over the silver layer to protect the silver layer against atmospheric or other corrosion so as to keep the outer surface of the silver layer unoxidized for a soldering operation during assembly.

Connectors 51 and 51′ (FIGS. 1, 3 and 9), or "feed-thrus" as they are called in the art, are provided as subassemblies. Each comprise a pin 52 with a flange 53 thereon near the upper end thereof. Metal cups or sleeves 54 with glass insulators 56 therein and sealed thereto are each mounted on a pin 51 and the insulator 56 is sealed to the pin.

In the method of manufacture the feed-thrus 51 and 51′ are assembled in the base 40 in the position shown best in FIG. 9, but of course, without the semiconductor unit and the housing there shown. So that the feed-thrus may be readily assembled they are dimensioned to fit rather loosely in the holes 43 and 44 of the base. However, in order to have a permanent and fully sealed connection between the base and these units preparations are made for soldering this connection in a subsequent process step. Accordingly, before a feed-thru is assembled on the mounting base 40, a solder preform 57 (box C, FIG. 1) is placed on the top of the base at each hole 43 and 44. A solder preform 58 of a size to fit over the top of a pin 52 is placed upon a sponge rubber pad, the pin is inserted into the hole of the preform and when the feed-thru is upended the preform 58 rests down against the integral flange 53 near the top of that pin. With the preforms 57 in position the feed-thrus 51 and 51′ are mounted in the base over the outside of each cup 54 to lay between the top of the base 40 and the inside of the flange at the top of such cup and this subassembly is ready for the semiconductor unit of box I (FIG. 1) to be placed in the position shown in box J.

Then the clip-die assembly including the clip 18 and the die subassembly held thereby is placed over the feed-thrus 51 and 51′ with the holes 31 and 32 in the clip 18 fitting respectively over the top of each pin 52 so that the flanges 33 and 34 rest against the preforms 58. In the enlarged showing of FIG. 9, the preforms 58, and also the preforms 57 have melted and fused into a soldered joint, as will be described, and representing only a small amount of solder do not readily show. However, in view of this explanation and the illustrations in box C, FIG. 1 details of a melted condition are not believed to be necessary for a full understanding. The clip-die assembly is supported by the flanges 53 of the feed-thrus 51 and 51′ and the pedestal 41 with the collector electrode 12 resting on the flat top 42 thereof.

At this stage, as above described, the die subassembly and the clip 18 as well as the feed-thrus 51 and 51′ are in precisely located positions on the mounting base 40 ready for assembly with one another and with that base in what is a self-jigging assembly.

The emitter lead arm 25 presses its disc-like end 26 thereof against the emitter electrode 11, the ring portion 19 and the tabs 21 thereon hold the base ring 13 therein, and the weight of the assembly holds the collector electrode 12 against the top 42 of the pedestal 41 in face-to-face contact therewith. This preassembled position is maintained more positively by a retaining action of the flanges 33 and 34 whose configuration also facilitates positioning the clip subassembly on the tops of the pins 52. Inasmuch as a firm and preferably a full face contact is desired at this step in the process between the collector button and the top 42 of the pedestal in the base, it would be a complex assembly operation if the small parts heretofore described were not of such construction that every move thereof is facilitated and positioning is certain. However, in practicing the present method on a mass production basis at high speed a full face contact in a parallel plane with the top 42 is not always possible. But the height and configuration of the pedestal 41 accommodates a slight tipping or slightly nonparallel position of the collector electrode and still makes it possible to have a fully soldered connection in the heat step which will be next described.

The assembly of box J is then placed in a furnace (not shown), and inert or reducing gas is introduced into the furnace. The furnace is heated to a temperature at which the solder rings 57 melt to wet the cup 54, and the base 40, and the flanges of the cups, while at the same time the silver and gold on the portion of the emitter lead arm 25 engaging the emitter electrode 11 and the upper face 42 of the pedestal 41 melt to wet the indium electrodes 11 and 12 thoroughly. The electrodes 11 and 12 also soften somewhat so that the portion 27 of the emitter lead 25 and the pedestal 41 embed themselves somewhat into the electrodes, and the base ring 13 is soldered to the ring 19 of the clip 18. Also, the preforms 57 melt to form the solder connections at the flanges of the pins 52 to secure the clip thereon. Actually seven soldered joints or connections are made in this heating step.

The assembly is then cooled to solidify the melted and softened portions and, in all, fuse the emitter lead end portion 26 to the emitter electrode 11, fuse the pedestal 41 to the collector electrode 12, fuse the open ring 19 of the base lead 35 to the base electrode 13, solder the clip 18 to the flange 53 of each of the connectors 51 and 51′, and solder the connectors 51 and 51′ at the flanges on the cups 54 to the mounting base 40 in air-tight, completely sealed relationship relative thereto. Then a section shown at the void 61 (FIG. 10, and box K of FIG. 1) in the arm 36 is cut out by a tool to separate the emitter lead 25 from the base lead 35. Thereafter the assemblage of elements is subjected to a known electrolytic cleanup or washing treatment.

Thereafter, a cover 65 (FIGS. 1, box L, and FIG. 9) having an outwardly turned bottom flange or rim 66 is placed in a position over the holder 18 in the die assembly with the rim of the cover resting on the bottom of the groove 47 in the base 40 and the inner wall of the cover abutting the inner wall of the groove 47. A hydraulic press (not shown) with a force applied of five to seven tons then presses a staking ring against the base 40 to form an annular ring 67 in the metal surrounding the outer wall of the groove 47 and swage it tightly over the flange 66 and against the cover 65.

In the swaging operation the punch or staking ring effecting the displacement of metal against the cover 65 is lightly lubricated with a top quality lubricant such as silicone oil. With this step the metal of the base 40 and the rim and lower portion of the cover are squeezed together so as to form a hermetic seal therebetween due, of course, to the mechanical force exerted by the swaging. The cover is fused to the mounting base at the top, bottom and end of the rim 66 and at the inner and outer walls of the portion of the cover just above the rim. The swaging is effected without applying heat to the elements 40 and 65 so that no spattering inherent in electrical welding and hot soldering operations occurs. The cover 65 also is held very strongly mechanically to the base 40 with the rim 66 acting as a firm anchor embedded in the base 40.

The above-described transistor is very rugged and has only a very thin layer of indium positioned between the p–n collector junction formed between the collector electrode 12 and the die 10. The electrode 12 is initially about .010″ thick, but after being fused to the pedestal 41 is less than .008″, and while indium is not one of the better heat conducting metals, the layer between the copper pedestal 41 and the p–n collector junction is thus so thin that no appreciable thermal barrier is present between the excellent heat conductive base 40 and the collector p–n junction. Thus, heat is transmitted very effectively away from the collector p–n junction to the pedestal 41 and the base 40. The final dimension occurs because during the planar alloying thereof with the n-type germanium die 10 to form a p–n junction 15 therebetween, the disc spreads somewhat and the thickness is somewhat reduced. Also during the soldering operation in which the collector electrode 12 is pressed against the pedestal 41 by the weight of the clip 18 and the die assembly therein, as well as by the gripping action at the tops of the feed-thrus 51 and 51′, the pedestal is slightly embedded in the collector electrode 12 when the latter is softened during the soldering operation. The final dimension of the indium layer is so thin that a negligible thermal barrier is present between the collector junction and the pedestal 41.

The pedestal forms the start of the heat path which also includes the mounting base 40 and a radiator 81 (FIGS. 13 and 14). The base 40, the pedestal 41 and the radiator 81 form an effective heat path, and heat dissipation between the collector junction and the base is such that less than 1° C. temperature rise occurs between the collector junction and base per watt of power dissipated in the transistor.

The cover 65 also may be secured to the base 40 by placing (FIG. 12) a soft solder or soft metal ring 72 in the groove 47 in the base 40 on top of the flange 66 of the cover 65. The cover 65, in this instance, is first placed in the groove 47 as in the principal embodiment. The press swages the outer rim of the metal of the base 40 at the groove 47 over the soft metal ring 72 to fuse the base metal and ring 72 to the cup rim and to lower sidewall of the cover 65. Except for the inclusion of the ring 72, it appears exactly as shown in FIG. 9. In both closures (FIGS. 9 and 12) there is a uniform bond over 360°, and as previously described, this cold-sealing provides a tight hermetic seal.

For application in an auto radio receiver, the transistor described above is preferably mounted by mounting screws 82 on the finned radiator or heat sink 81 previously referred to. The radiator 81 may be a cast or extruded one-piece aluminum member which is mounted on the side or the chassis of a radio receiver 83 by bolts 84 to the housing. In one circuit in which the power transistor of the present invention is used, the radiator 81 is grounded electrically to the chassis of the radio and the base 40 of the transistor and the collector electrode 12 are connected electrically to the radiator 81 so that it is kept at ground potential in the illustrated embodiment. In other applications for the power transistor, the radio may have to be electrically insulated from the transistor portion of the system. However, in either case, the radiator 81 having high thermal and electrical conductivities, takes advantage of corresponding characteristics in the base 40 of the power transistor herein described and provides maximum efficiency for the radio circuit employing the transistor.

Although the heat radiator 81 and the radio receiver of FIG. 13 are not part of the present invention, together they illustrate the convenient, simple and complete mechanical mounting made possible by the base 40 of the transistor, and illustrate the importance of heat dissipation which is referred to frequently in this specification. It is seen in FIG. 13, but particularly in FIG. 14, that the radiator 81 has a channel 85 formed between radiating fins 86 and 87 to permit mounting the transistor.

The radiator 81 may also be provided with a second channel 88 positioned between radiating fins 89 and 90 to mount a second transistor (not shown) similar to the one disclosed hereinabove for use of the transistors as a push-pull audio amplifier. It is clear from the illustrations that the connectors 51 and 52 may be easily connected to other components in the radio and so operated.

The structure and method of manufacture as above described embody my invention so that a transistor may be fabricated very rapidly, requires no jigging during the soldering operation thereon, and effects all soldering operations in a single easy step. Since the parts to be joined have silver protected by gold thereon, no flux is required during the soldering operation and spattering and contamination of the die assembly and contacts are thereby prevented.

While the die assembly or semiconductor unit described has been indicated to be a p-n-p type, it obviously could be an n-p-n transistor. Also, while illustrated as an alloy junction type transistor with heavy emitter and collector electrodes, other types of semiconductor units as diffused base transistor die assemblies, for example, with electroplated or vapor plated electrodes could be used in place of the alloy junction die assembly described herein. Also, the invention is not limited to a three electrode semiconductor device, and the excellent heat dissipation from the pedestal-in-the-base construction for direct application of a semiconductor die assembly could be utilized in devices with a different number of electrodes.

Power transistors constructed in acordance with the present invention have the selected dimensions as hereinafter given and carry the following ratings, all of which are listed solely for purposes of illustration and are not intended to limit the scope of the invention in any way.

*Dimensions of Constructed Unit*

| | |
|---|---|
| Mounting base 40: | |
| Length | 1.56″. |
| Width | 1.12. |
| Thickness | 0.125 plus or minus .010. |
| Pedestal 41: | |
| Height | 0.062″. |
| Diameter at top | 0.140″. |
| Sides | At 45° angle. |
| Cover 65 when sealed to base: | |
| Outside diameter | 0.800″. |
| Outside height above top surface of base | 0.41″. |
| Cover 65 before mounting: | |
| Outside height | 5/16″. |
| Outside diameter of rim | 0.848″ plus or minus .002. |
| Die 10 before assembly: | |
| Diameter | 0.260 plus or minus .002. |
| Thickness | 0.0080 plus or minus .0002. |

*Maximum Ratings*

| | |
|---|---|
| Collector D.C. voltage | −16 v. |
| Instantaneous peak collector voltage referred to emitter | −30 v. |
| Collector D.C. current | −3 a. |
| Collector dissipation at mounting base temp. 80° C | 10 w. |
| Storage temperature | 90° C. |

I claim:

1. A semiconductor device including in combination a mounting unit serving as a base having a plurality of protruding parts extending upwardly from one surface thereof, with each protruding part having a configuration so that said protruding parts together receive and retain pieces for said device in position thereon without the use of independent jigs or fixtures to position pieces during the fabrication of the semiconductor device, a semiconductor assembly including a semiconductor die and die connecting means therewith having a plurality of portions and with each such a portion supported at a corresponding one of said protruding part configurations, fusible metal at each junction of a portion and a protruding part originally in the form of preformed pieces and upon melting and then cooling acting to secure said connecting means to said protruding parts, and means to encapsulate the pieces on the mounting unit.

2. In a semiconductor device having therein a semiconductor die unit, the combination of means for mounting said unit and providing electrical connections thereto, including a diamond-shaped metal base having mounting bores at the extremities of the longitudinal axis of the base and a circular area intermediate the bores and centered relative to the transverse axis of said base, a pedestal raised from one surface of the mounting base within said circular area and on the longitudinal axis of the base, a pair of connecting pins secured in the base within said circular area in a position on each side of the longitudinal axis and at one side of said transverse axis away from said pedestal, so that said pedestal and said two connecting pins are positioned within said circular area substantially in an equilateral triangular pattern, with said semiconductor die unit supported on the top of said pedestal, and connecting means from each of said pins to said unit.

3. In a semiconductor device having therein a semiconductor die unit with contact portions thereon, the combination of a mounting base having a flat-topped pedestal and a pair of connecting pins upstanding from one surface of the mounting base and positioned thereon in a triangular three-cornered pattern with each pin having a mounting portion thereon spaced from said surface a distance corresponding generally to the height of the pedestal, with said semiconductor die unit positioned on and connected to the top of the pedestal at a contact portion, connector structure mounted on said pins at the pin-mounting portions and on said pedestal at said die unit for electrically connecting said two pins and said die unit, with said semiconductor die unit and connector structure all in positions substantially horizontal to the surface of said mounting base and at a position spaced therefrom by the pedestal top and pin-mounting portions, and with said unit contact portion on the pedestal top being substantially uniform in depth over the area engaged, and with the connector structure anchored at said pins without the use of a jig or fixture against movement relative to the pedestal during the assembly of the semiconductor device, and means for covering said unit and connector structure.

4. Semiconductor apparatus including in combination a base with bores therein and said base having effective heat conducting properties, said base having a pair of surfaces and having a pedestal rising from one of said surfaces, a semiconductor device including a semiconductor element having a first and a second contact means on one side thereof, and a third contact means on the other side of said semiconductor element, with said third contact means electrically and mechanically bonded to said pedestal at the top thereof, a pair of conductor-means each comprising a pin extending through said base at a bore therein, insulator means on the pin in a position to insulate the pin from the base, and with the pin of each of the conductor-means extending above said base surface from which said pedestal rises and positioned in said base so that said pins and said pedestal stand substantially at points corresponding to the three corners of what is essentially an equilateral triangle, connector means extending from said first contact means to one of said conductor-means pins and soldered thereto, connector means extending from the second contact means to the other of said conductor-means pins and soldered thereto, and with said connector means being positioned on and maintained substantially against lateral movement at said conductor-means pins prior to soldering whereby to maintain the same referenced relative to the semiconductor device contact means before soldering, and solder pieces to solder said pair of conductor-means to said base at said base bores in which said latter means are positioned.

5. In a subassembly which includes a semiconductor die unit with contacts thereon for incorporation into a transistor device which has rigid lead wires upstanding thereon, said subassembly including the means for mounting the semiconductor die unit and electrically connecting the same into the transistor device having a portion providing a seat and contact for said unit, a pair of contact arms with one arm extending in one direction and the other arm extending in another direction away from said portion and positioned in the same general plane of such portion, and each contact arm having an apertured portion therein adapted to be dropped onto the rigid lead wires in the transistor device and to be soldered thereto for securing the subassembly into the transistor device.

6. In an alloy junction type transistor including a preassembled semiconductor unit with electrodes thereon and with at least two thereof being of the alloy junction type and said transistor including structural pieces adapted to provide an effective transistor operation when assembled and facilitating the assembly thereof substantially without jigs or fixtures, the combination of such structural pieces including a mounting unit having upstanding posts therein and adapted to support the semiconductor unit as well as solderable connector means thereon, solderable connector means including a receiving area having the semiconductor unit therewith and having mounting portions, with at least one such mounting portion on each corresponding one of said upstanding posts and positioned there without the use of jigs or fixtures, meltable material at each junction of a post and a connector means portion, and with at least one of the alloy junction type electrodes being in contact with said mounting unit and being of a meltable material, all of said meltable materials adapted to melt substantially at one time in a furnace and to solidify on cooling and secure each said mounting portion to a corresponding post and secure said semiconductor unit and to the connector means, and means to encapsulate the structural pieces and semiconductor unit in assembled condition.

7. In an alloy junction type transistor including a preassembled semiconductor unit with electrodes thereon and with at least two thereof being of the alloy junction type and said transistor including structural pieces adapted to provide an effective transistor operation when assembled and facilitating the assembly thereof substantially without jigs or fixtures, the combination of such structural pieces including a mounting unit having upstanding posts therein and adapted to support on such mounting unit the semiconductor unit as well as solderable connector means, solderable connector means including a receiving area having the semiconductor unit at the receiving area, mounting portions on said solderable connector-means and each such mounting portion having an opening therein fitting over a corresponding one of said upstanding posts and being positioned and maintained there during assembly of the transistor without the use of jigs or fixtures, said connector-means serving to position the semiconductor unit in a predetermined place on the mounting unit, meltable material originally in pieces at each junction of a post and a connector means portion, and with at least one of the alloy junction type electrodes being in contact with said mounting unit and being of a meltable material, all of said meltable materials adapted to melt substantially at one time in a furnace and to solidify on cooling and secure each said mounting portion to a corresponding post and secure said semiconductor unit to said mounting unit and to the connector means, and means to encapsulate the structural pieces and semiconductor unit in their assembled condition.

8. In an alloy junction type transistor having a semiconductor die with contact means thereon and said transistor including structural pieces which are adapted to provide an effective transistor operation when assembled and which facilitate the assembly of such pieces substantially without jigs and fixtures, the combination of such structural pieces including a mounting unit having upstanding posts therein, solderable connector means having an area for engagement with the semiconductor die at contact means thereon and in fused connection therewith, mounting portions on said connector means each having a configuration with an opening which positions and retains such mounting portion on a corresponding post, with said mounting portions during the fabrication of the transistor being positioned on such corresponding posts at an opening without the use of jigs or fixtures, meltable solder material at each junction of a post and a connector means portion, said meltable solder material being meltable in a furnace upon passage of the structural piece assembly therethrough and being solidifiable on cooling to secure each said mounting portion to a corresponding upstanding post, and encapsulating means for said structural pieces and semiconductor die and contact means assembly.

9. A transistor including in combination a diamond-shaped copper base with high heat dissipating properties and having an element receiving-area defined on one surface thereof and a pedestal integral with said base and rising above said surface inside said element-receiving-area, mounting portions at each end of the diamond-shaped copper base, rigid pins extending through said copper base in said element-receiving-area and above said surface serving as positioning members and as electrical connections for a semiconductor unit in the transistor, a semiconductor unit and a connector assembly all being assembled on the pins and on the pedestal in a self-jigging manner and in an accurately aligned and rigidly retained position, said connector assembly including stamped-out-metal means in contact with and having at least a portion thereof resting on said semiconductor unit and having additional portions, with one of each such additional portions positioned respectively on corresponding rigid pins in said base but insulated from said base and out of physical contact therewith, with said stamped-out-metal means having a severable portion severed during the assembly of the transistor and maintained in the severed condition so that each of said additional portions on rigid pins is electrically insulated from another, and means on said base enclosing the rigid pins and the semi-conductor unit and the connector assembly.

10. A semiconductor device including in combination a metal base capable of conducting heat away from the device into a mounting for the device and having a semiconductor die unit mounting portion thereon, said combination also including first and second electrical conductors upstanding from one surface of the base and with each electrical conductor spaced away from said die unit mounting portion, a first metal connecting member extending from said first electrical conductor to said die unit and having an integral enlarged portion at one end corresponding generally in size with the outside dimensions of the semiconductor die unit and being open in the center thereof, with the enlarged portion thereof being in a fused mechanical and electrical connection with the die unit, said first metal connecting member having a portion at the other end which is apertured and is positioned at the aperture over said first electrical conductor, a second metal connecting member extending from the second electrical conductor to said semiconductor die unit having an integral end portion mechanically and electrically connected to the die unit, which integral end portion is smaller than the enlarged open center portion of the first metal connecting member and is generally centered relative to said enlarged open center portion and out of contact therewith, said second metal connecting member being apertured at its other end and positioned at the aperture over said second electrical conductor, and solder material originally provided for said device in a preformed structure at each electrical conductor and corresponding metal connecting member juncture, which solder material after heating to melt and then cooling to harden secures each said electrical conductor and corresponding connecting member together.

11. A semiconductor device including in combination a metal base capable of conducting heat away from the device into a mounting for the device and having a pedestal portion thereon for receiving and mounting a semiconductor die unit, said combination also including first and second electrical conductors upstanding from one surface of the base and with each electrical conductor spaced away from said die unit mounting portion and each conductor having a positioning portion at a predetermined distance from the surface of the metal base, a semiconductor die unit on said pedestal portion, a first metal connecting member extending from said first electrical conductor to said die unit and having an integral enlarged portion at one end corresponding generally in size with the outside dimensions of the semiconductor die unit and being open in the center thereof, with the enlarged portion thereof being in a fused mechanical and electrical connection with the die unit, said first metal connecting member having a portion at the other end which is apertured and is positioned at the aperture over said first electrical conductor adjacent the positioning portion on the conductor, a second metal connecting member extending from the second electrical conductor to said semiconductor die unit having an integral end portion mechanically and electrically connected to the die unit, which integral end portion is smaller than the enlarged open center portion of the first metal connecting member and is generally centered relative to said enlarged open center portion and out of contact therewith, said second metal connecting member being apertured at its other end and positioned at the aperture over said second electrical conductor adjacent the positioning portion on the conductor, and solder material originally provided for said device in a preformed structure at each electrical conductor and corresponding metal connecting member juncture, which solder material after heating to melt and then cooling to harden secures each electrical conductor and corresponding connecting member together in a predetermined position on the metal base.

12. In a semiconductor device; the combination including a diamond-shaped metal base capable of conducting away from said device heat generated in the operation thereof and also being electrically conductive, said metal base having a mounting portion at each extremity of the longitudinal axis of said base and a circular area intermediate the mounting portions and centrally of the transverse axis of said base, a semiconductor die unit mounted on said metal base within said circular area and positioned therein at one point of a substantially triangular pattern described by said one point and by two additional points in the circular area, a combination conductor and mounting means at each of the two additional points, with each combination means insulatingly supported on the metal base and spaced from the other combination means, stamped-out-metal-connecting means extending from said semiconductor die unit to each of said combination conductor and mounting means and having an aperture therein in the portion thereof at a combination means and receiving the corresponding combination means in the portion aperture, with said stamped-out-metal-connecting means being soldered to said respective combination means in a mechanical and electrical connection with each.

13. In a semiconductor device; the combination including a diamond-shaped metal base capable of conducting away from said device heat generated in the operation thereof, said metal base having a mounting portion at each extremity of the longitudinal axis of said base and a circular area intermediate the mounting portions and centrally of the transverse axis of said base, with said mounting portions extending beyond the circular area at each such part of the metal base and with said metal base being confined in width substantially to that of the circular area at the transverse axis so as to minimize the space occupied by the metal base at said transverse axis, a semiconductor die unit mounted on said metal base within said circular area and positioned therein at one point of a substantially triangular pattern described by said one point and by two additional points in the circular area, a combination conductor and mounting means at each of the two additional points, with each said combination means being secured to the metal base, stamped-out-metal-connecting means in the device extending from said semiconductor die unit to each of said combination conductor and mounting means and having apertures therein in the portion thereof at a combination means and receiving the corresponding combination means in that aperture, with said stamped-out-metal-connecting means being soldered to said respective combination pins in a mechanical and electrical connection with each.

14. In a semiconductor device, the combination including a diamond-shaped metal base adapted to conduct from the device heat which is generated in the operation of the device and having a mounting bore adjacent each extremity of the longitudinal axis of said base, a circular area defined between the mounting bores and centrally of the base on the transverse axis of said base for receiving the operating components of said device wholly within such area, said metal base extending for a greater distance beyond the circular area at the mounting bores than it extends beyond the circular area at the transverse axis, a semiconductor unit mounted on said metal base within said circular area and at one point of a three-point triangular pattern including also a metal conductor means at each of said other two points, and with each metal conductor means secured in said metal base and spaced apart from one another within the circular area as well as each being spaced from said one point in the pattern, and stamped-metal connector means for the device having two apertured portions, with each such apertured portion being mounted on a corresponding metal conductor means at the aperture thereof and soldered to said metal conductor means at the aperture thereof and soldered to said metal conductor means, and with each said portion extending from the metal conductor means to the semiconductor unit and connected thereto in a fused connection.

15. In a semiconductor device having a diamond-shaped metal base with heat-conducting properties such as to serve to conduct heat developed in the operation of the device from said device into a mounting for the device, and adapted to be mounted at the longitudinal extremities of said base in the operation of the device; semiconductor and electrically conducting structure therefor including in combination a circular assembly portion on one surface of the base located substantially centrally relative to the longitudinal axis and to the transverse axis thereof, a semiconductor unit mounted in said assembly portion in a generally horizontal position and having at least a first contact and a second contact on one side of the unit and having at least one contact on the other side of the semiconductor unit, with said latter contact being connected to the base in said assembly portion in a fused connection, a pair of conductor means with each including a portion insulatingly mounted in the diamond-shaped metal base and extending above the diamond-shaped base surface for having a connection made thereto within said assembly portion, said pair of conductor means and said semiconductor unit being positioned within said assembly portion at points corresponding generally to the three corners of a triangle, an electrical connecting portion extending from a conductor means to said first contact on the semiconductor unit and secured thereto in a fused connection, another electrical connecting portion extending from the second conductor means to said second contact and secured thereto in a fused connection, and with said conductor means, said connecting portions, and said semiconductor unit comprising together an operating structure within the assembly portion when said semiconductor device is connected into a circuit.

16. In a semiconductor device having therewith a semiconductor die unit with contacts thereon consisting of meltable material, the combination mounting base means of diamond-shaped configuration and with the longitudinal axis thereof being longer than the transverse axis thereof, said mounting base means having a mounting area centrally thereof, a pedestal within the mounting area having a flat top thereon and serving as one electrical connection from the semiconductor die unit when said semiconductor device is ultimately operated in apparatus, a pair of conductor members upstanding within the mounting area and each spaced away from the pedestal, said semiconductor die unit being on the pedestal with one contact of meltable material fused to the flat top by said contact-meltable material upon heating thereof to a melted condition and subsequent cooling, rigid connector means between each conductor member and the semiconductor die unit and fused at one end to a contact of meltable material and at the other end to a conductor member, and means to encapsulate the device at the mounting area, with said diamond-shape mounting base means having extensions on the longitudinal axis thereof outside the mounting area and with said extensions adapted for receiving means for mounting said semiconductor device into apparatus for an operation thereof.

17. In a semiconductor device having therewith a semiconductor die unit comprising a semiconductor die with contacts thereon consisting of meltable material, the combination of mounting base means of diamond-shape configuration and with the longitudinal axis thereof being longer than the transverse axis thereof, said mounting base means having a mounting area centrally thereof, a pedestal within the mounting area having a flat top thereon and sides sloping outwardly and downwardly therefrom, said pedestal serving as one electrical connection from the semiconductor die unit when said semiconductor device is ultimately operated in apparatus, a pair of conductor members upstanding within the mounting area and each spaced away from the pedestal, said semiconductor die unit being on the pedestal with one contact of meltable material fused to the flat top by said contact-meltable material upon heating thereof to a melted condition and subsequent cooling, said meltable material of said contact upon being heated to a melted condition flowing in part thereof from the flat top of the pedestal down the sloping sides thereof and reducing the mass of material in the contact and positioning the semiconductor die closer to the pedestal when the die unit is fused thereto and thereby providing heat transfer from the semiconductor die to the pedestal through a mass of contact material less than the mass thereof in the original semiconductor-die-unit condition, rigid connector means between each conductor member and the semiconductor die unit and fused at one end to a contact of meltable material and at the other end to a conductor member, and means to encapsulate the device at the mounting area, with said diamond-shape mounting base means having extensions on the longitudinal axis thereof outside the mounting area, and with said extensions adapted for receiving means for mounting said semiconductor device into apparatus for an operation thereof.

18. In a semiconductor device having a semiconductor die unit therewith, the combination including structural pieces which have the multiple functions of facilitating an assembly thereof without the use of independent jigs or fixtures to position such pieces when the device was fabricated and of acting after the device is completed to provide an effective electronic operation, when it is connected into an electronic circuit, said structural pieces including a mounting unit with a mounting surface having conductor members therewith upstanding directly from said mounting surface and having the semiconductor die unit thereon, said conductor members being particularly adapted to serve as electric conductors in a completed semiconductor device and of a configuration to receive and retain connector means there, connector means in fused connection with the semiconductor die unit, said connector means having mounting portions and each of said mounting portions having an opening therein, with connector-means-mounting portions being positioned at said openings therein on corresponding conductor members during the fabrication of the semiconductor device and without the use of jigs or fixtures for said positioning and being maintained in said position during the remainder of said fabrication without the use of jigs and fixtures, and meltable solder material at each junction of a conductor member and a connector-means-mounting portion, said material being at each said junction during the fabrication of the device and meltable in the presence of heat after said structural pieces are in place, and then being solidifiable on cooling to secure each said mounting portion to a corresponding upstanding conductor member.

19. In a semiconductor device having a semiconductor die unit, the combination including a metal mounting unit having upstanding conductor members therewith and an upstanding portion from one surface with the semiconductor die unit thereon, with said upstanding portion being positioned so that the conductor members are displaced to each side therefrom and having a top surface of a predetermined dimension above said mounting unit surface, each conductor member having a flange thereon spaced from the mounting unit surface a predetermined dimension which is related to said dimension from the mounting unit surface to the top surface of the upstanding portion so that solderable connector members will position properly on the flanges and relative to said top surface, solderable connector members and each having an opening, with one of said connector members being in fused connection with the semiconductor die unit on the upstanding portion adjacent the top surface thereof and in fused connection with a conductor member at the flanges thereon and in a generally horizontal position relative to the mounting unit surface, a second connector member in fused connection with the die unit and with a corresponding conductor member at its flange, with said connector members during the fabrication of the semi-conductor device being positioned at an opening in each member on such conductor members as well as on the die unit without the use of independent jigs or fixtures, and solder material originally in preformed pieces with such an piece at each junction of a conductor member and a connector member adapted to be melted and cooled to secure them together upon cooling.

20. In a semiconductor device having a semiconductor die unit therewith, the combination which includes a metallic diamond-shaped mounting base having a mounting portion at each end of the longitudinal axis thereof with a circular assembly area intermediate such ends and on the longitudinal and the transverse axes of such mounting base, conductor members and a mounting pedestal on said base within said assembly area and upstanding from the surface of said mounting base, said semiconductor die unit being fused on said mounting pedestal, rigid connector means in fused connection with the semiconductor die unit, said rigid connector means having apertured mounting portions, said apertured mounting portions being positioned on corresponding conductor members at the apertures of said mounting portions, solder material at each junction of a conductor member and said connector means which is originally in individual preformed pieces and after heating for melting and then cooling thereof secures each mounting portion to a corresponding upstanding conductor member in a soldered connection, and means to encapsulate said semiconductor die unit, said rigid connector means and said upstanding conductor members.

21. In a semiconductor device having a semiconductor die unit therewith, the combination of structural pieces including metal mounting means in a diamond shape with a central mounting area intermediate the ends of the longitudinal axis thereof and extending substantially over the transverse axis of the mounting means, with the longitudinal axis of the metal mounting means being longer than the transverse axis, a pair of upstanding conductor members in said central mounting area and said die unit being secured in said central mounting area, with said conductor members and said die unit positioned in a three-point triangular pattern within said central mounting area, solderable connector means in fused connection with the semiconductor die unit and a conductor member and apertured to fit over the conductor member, another solderable connector means apertured and fitting over a second conductor member and in fused connection with the die unit, and solder material which is originally in individual pieces at each junction of a conductor member and a connector means which after heating to melted condition and then cooling acts to secure the structural pieces together in a fixed assembly at such junctions.

References Cited in the file of this patent

UNITED STATES PATENTS

| | | |
|---|---|---|
| 1,571,907 | McClanahan | Feb. 2, 1926 |
| 1,855,729 | Richards | Apr. 26, 1932 |
| 2,005,682 | Pool | June 18, 1935 |
| 2,444,312 | Roberds et al. | June 29, 1948 |
| 2,472,131 | Toth | June 7, 1949 |
| 2,725,505 | Webster et al. | Nov. 29, 1955 |
| 2,744,308 | Loman | May 8, 1956 |
| 2,745,044 | Lingel | May 8, 1956 |
| 2,757,322 | James | July 31, 1956 |
| 2,762,001 | Kilby | Sept. 4, 1956 |
| 2,762,956 | Ingraham | Sept. 11, 1956 |
| 2,796,563 | Ebers et al. | June 18, 1957 |
| 2,822,498 | Koskos et al. | Feb. 4, 1958 |
| 2,836,878 | Shepard | June 3, 1958 |
| 2,847,623 | Thornhill | Aug. 12, 1958 |
| 2,853,662 | Woods | Sept. 23, 1958 |
| 2,862,160 | Ross | Nov. 25, 1958 |
| 2,876,401 | Fuller | Mar. 3, 1959 |
| 2,882,462 | Zierdt | Apr. 14, 1959 |
| 2,894,183 | Fermanian | July 7, 1959 |
| 2,905,873 | Ollendorf et al. | Sept. 22, 1959 |
| 2,913,642 | Jenny | Nov. 17, 1959 |
| 2,919,387 | Cornelison | Dec. 29, 1959 |
| 2,929,972 | Roka | Mar. 22, 1960 |
| 2,962,639 | Pensak | Nov. 29, 1960 |